United States Patent [19]
Matsuoka et al.

[11] Patent Number: 5,866,302
[45] Date of Patent: Feb. 2, 1999

[54] PATTERN FORMATION METHOD

[75] Inventors: Koji Matsuoka, Hirakata; Akiko Katsuyama, Moriguchi; Takahiro Matsuo, Kyoto; Masayuki Endo, Izumi, all of Japan

[73] Assignee: Matsushita Electric Industrial Co., Ltd., Osaka, Japan

[21] Appl. No.: 892,070

[22] Filed: Jul. 14, 1997

[30]  Foreign Application Priority Data

Jul. 16, 1996 [JP] Japan .................................. 8-185725

[51] Int. Cl.⁶ ...................................................... G03F 7/00
[52] U.S. Cl. .......................... 430/313; 430/327; 430/330; 438/760
[58] Field of Search .................................... 430/311, 313, 430/330, 327; 438/626, 646, 760

[56]  References Cited

U.S. PATENT DOCUMENTS

| 5,219,788 | 6/1993 | Abernathey et al. | 437/187 |
| 5,285,102 | 2/1994 | Ying | 257/638 |
| 5,369,061 | 11/1994 | Nagayama | 437/228 |
| 5,552,342 | 9/1996 | Itou | 437/195 |
| 5,656,556 | 8/1997 | Yang | 438/646 |
| 5,670,404 | 9/1997 | Dai | 437/52 |

FOREIGN PATENT DOCUMENTS 0608474  8/1992  Japan .

*Primary Examiner*—Kathleen Duda
*Attorney, Agent, or Firm*—McDermott, Will & Emery

[57]  ABSTRACT

A BPSG film is formed on a semiconductor substrate and caused to reflow under an atmosphere of flowing Ar gas. Then, a chemically amplified resist is applied to the surface of the BPSG film to form a resist film, which is exposed to the irradiation of a KrF excimer laser through a mask. Since no lone pair of electrons exists on the surface of the BPSG film, an acid in the resist film is not deactivated and hence a reaction is evenly induced by an acid catalyst. After the development of the resist film, a resist pattern having an excellent profile with no footing is obtained.

5 Claims, 7 Drawing Sheets

PATTERN FORMATION METHOD

BACKGROUND OF THE INVENTION

The present invention relates to a method of forming a pattern by a lithographic process in accordance with a method of manufacturing a semiconductor device.

With recent decreases in design rules for a semiconductor device such as an IC or LSI, development has been directed toward a lithographic process using a light source of a shorter wavelength such as a KrF excimer laser (of a wavelength of 248 nm) or an ArF excimer laser (of a wavelength of 193 nm), which is for forming a minuscule pattern in a manufacturing process of a semiconductor device. In the lithographic process using a light source of a shorter wavelength, a chemically amplified resist embodying the concept of chemical amplification has generally been employed.

The chemically amplified resist is composed of a multicomponent-system substance containing an acid generator which generates an acid in response to the irradiation of an energy beam and a compound which reacts with the acid. The chemically amplified resist uses a reaction induced by an acid catalyst to change its dissolution property with respect to a developing agent, thereby enabling the formation of a minuscule resist pattern.

A description will be given to a conventional pattern formation method with reference to FIGS. 6(a) to 6(d).

First, as shown in FIG. 6(a), a BPSG film 2 as an insulating film is deposited to a thickness of 700 nm on a semiconductor substrate 1 and subjected to a thermal treatment at a temperature of 850° C. under an atmosphere of flowing $N_2$ gas as inert gas, so that the BPSG film 2 is caused to reflow. During the reflow process, a nitride layer 2a is formed from the $N_2$ gas on the surface of the BPSG film 2.

Next, as shown in FIG. 6(b), a binary-system positive chemically amplified resist (such as WKR-PT-3 commercially available from Wako Pure Chemical Industries, Ltd.) is applied onto the BPSG film 2 by spin coating and subjected to pre-baking, thereby forming a resist film 5.

Next, as shown in FIG. 6(c), exposure to a KrF excimer laser 7 is performed using a mask 6, followed by post-exposure baking.

Next, as shown in FIG. 6(d), the resist film 5 is developed in an aqueous alkaline solution to provide a resist pattern 8.

In this case, the decomposition reaction of the compound caused by the acid generated from the chemically amplified resist proceeds in the exposed portion of the resist film 5. In other words, the reaction induced by the acid catalyst changes the alkali-soluble property of the chemically amplified resist, which enables the formation of a minuscule resist pattern.

However, in the case of forming a resist pattern on the BPSG film 2 by using the positive chemically amplified resist, footing is observed in the resist pattern 8 as shown in FIG. 6(d), so that a resist pattern having an excellent profile is not formed. Specifically, if the resist pattern 8 composed of the positive chemically amplified resist is formed on an insulating film having a reflowing property, such as the BPSG film 2, which has been deposited and caused to reflow for planarization at a temperature of about 800° to 900° C. under an atmosphere of flowing $N_2$ gas, footing is observed in the resist pattern 8 so that a resist pattern having an excellent profile is not formed. If the resist pattern 8 composed of a negative chemically amplified resist is formed, on the other hand, undercut is observed in the resist pattern 8 so that a resist pattern having an excellent profile is not formed, either. The degraded profile and resolution of the resist pattern composed of the chemically amplified resist may adversely affect the subsequent process.

In the case of forming a resist pattern composed of a chemically amplified resist on a nitride film containing nitrogen atoms, such as a TiN film or SiN film, formed on a semiconductor substrate, the profile and resolution of the resist pattern are also degraded.

To prevent the foregoing degradation, there have been proposed a method of forming a Si thin film on a semiconductor substrate (see U.S. Pat. No. 5,219,788) and a method of forming an oxide film on a semiconductor substrate (see Japanese Laid-Open Patent Publication HEI 6-84774).

FIG. 7 shows the structure of a semiconductor device manufactured in accordance with the former one of the conventional methods. As shown in the drawing, a thin film 9 made of Si or $SiO_2$ and containing Si is formed on a BPSG film 2 formed on a Si substrate and a resist pattern 8' is formed on the thin film 9.

However, it is difficult to implement the method of forming the thin film 9 containing Si on the surface of the BPSG film 2 because of a reduction in throughput caused by an increased number of process steps, a reduction in production yield caused by dust accompanying the increased number of process steps, and the necessity to etch a bi-layer film consisting of the thin film 9 containing Si and the BPSG film 2, which lead to lack of control and increased manufacturing cost.

SUMMARY OF THE INVENTION

In view of the foregoing, it is therefore an object of the present invention to enable the formation of a resist pattern having an excellent profile with no footing or undercut. The resist pattern is composed of a chemically amplified resist and formed on an insulating film caused to reflow or on a nitride film without undergoing a complicated process.

When a resist pattern composed of a chemically amplified resist is formed on an insulating film, such as a BPSG film, which has been caused to reflow under an atmosphere of flowing $N_2$ gas, or on a TiN or SiN film containing nitrogen atoms, footing or undercut is observed in the resist pattern. The present inventors have examined the cause of footing and undercut observed in the resist pattern and found that the lone pair of electrons of a nitrogen atom present on the insulating film caused to reflow or on the nitride film is bonded to an acid generated from the chemically amplified resist responsive to exposing light at the interface between the insulating film or nitride film and the chemically amplified resist film, which deactivates the acid. As a result, a satisfactory reaction is not induced by an acid catalyst and hence the dissolution property of the chemically amplified resist with respect to a developing agent is not changed to a sufficient degree for forming a resist pattern. Consequently, the portion of the chemically amplified resist in which the satisfactory reaction is not induced by the acid catalyst is not developed completely by the developing agent. Accordingly, footing is observed in the resulting resist pattern when a positive chemically amplified resist is used, while undercut is observed in the resulting resist pattern when a negative chemically amplified resist is used, so that a resist pattern having an excellent profile is not formed.

The present invention has been achieved based on the foregoing finding. According to the present invention, the influence of the lone pair of electrons of a nitrogen atom present on the surface of the insulating film caused to reflow or on the nitride film is eliminated before the chemically amplified resist is applied to form a pattern.

A first pattern formation method according to the present invention comprises: an insulating-film depositing step of depositing an insulating film having a reflowing property on a semiconductor substrate; a reflow step of thermally treating the insulating film under an atmosphere of flowing inert gas containing at least one of He, Ne, Ar, Kr, and Xe so as to cause the insulating film to reflow; a resist-film forming step of applying a chemically amplified resist to a surface of the insulating film caused to reflow to form a resist film; and a pattern forming step of exposing the resist film to light and developing the exposed resist film to form a pattern composed of the resist film.

In accordance with the first pattern formation method, the insulating film having a reflowing property is thermally treated to reflow under the atmosphere of flowing inert gas containing at least one of He, Ne, Ar, Kr, and Xe, so that no nitride layer is formed on the surface of the insulating film and therefore no lone pair of electrons of a nitrogen atom exists. Consequently, the chemically amplified resist can be applied to the surface of the insulating film with no lone pair of electrons of a nitrogen atom. As a result, the reaction induced by the acid catalyst in the chemically amplified resist which has been exposed to light proceeds without being influenced by a lone pair of electrons, which enables the formation of a resist pattern having an excellent profile with no footing or undercut.

A second pattern formation method according to the present invention comprises: an insulating-film depositing step of depositing an insulating film having a reflowing property on a semiconductor substrate; a reflow step of thermally treating the insulating film under an atmosphere of flowing gas containing oxygen atoms so as to cause the insulating film to reflow; a resist-film forming step of applying a chemically amplified resist to a surface of the insulating film caused to reflow to form a resist film; and a pattern forming step of exposing the resist film to light and developing the exposed resist film to form a pattern composed of the resist film.

In accordance with the second pattern formation method, the insulating film having a reflowing property is thermally treated to reflow under the atmosphere of flowing gas containing oxygen atoms, so that no nitride layer is formed on the surface of the insulating film and therefore no lone pair of electrons of a nitrogen atom exists. Consequently, the chemically amplified resist can be applied to the surface of the insulating film with no lone pair of electrons of a nitrogen atom. As a result, the reaction induced by the acid catalyst in the chemically amplified resist which has been exposed to light proceeds without being influenced by a lone pair of electrons, which enables the formation of a resist pattern having an excellent profile with no footing or undercut.

A third pattern formation method according to the present invention comprises: an insulating-film depositing step of depositing an insulating film having a reflowing property on a semiconductor substrate; a reflow step of thermally treating the insulating film under an atmosphere of flowing $N_2$ gas so as to cause the insulating film to reflow; a surface-layer removing step of removing a surface layer of the insulating film caused to reflow; a resist-film forming step of applying a chemically amplified resist to a surface of the insulating film from which the surface layer has been removed to form a resist film; and a pattern forming step of exposing the resist film to light and developing the exposed resist film to form a pattern composed of the resist film.

In accordance with the third pattern formation method, the insulating film having a reflowing property is thermally treated to reflow under the atmosphere of flowing $N_2$ gas, so that a nitride layer is formed on the surface of the insulating film. However, since the surface layer of the insulating film is removed, the lone pair of electrons of a nitrogen atom present on the surface of the insulating film is also removed. Consequently, the chemically amplified resist can be applied to the surface of the insulating film with no lone pair of electrons of a nitrogen atom. As a result, the reaction induced by the acid catalyst in the chemically amplified resist which has been exposed to light proceeds without being influenced by a lone pair of electrons, which enables the formation of a resist pattern having an excellent profile with no footing or undercut.

A fourth pattern formation method according to the present invention comprises: an underlying-film forming step of forming an underlying film containing nitrogen atoms on a semiconductor substrate; a cation implanting step of implanting cations in the underlying film; a resist-film forming step of applying a chemically amplified resist to a surface of the underlying film in which the cations have been implanted; and a pattern forming step of exposing the resist film to light and developing the exposed resist film to form a pattern composed of the resist film.

In accordance with the fourth pattern formation method, the cations are implanted in the underlying film containing nitrogen atoms and deposited on the semiconductor substrate so that the lone pairs of electrons of the nitrogen atoms and the implanted cations are bonded to each other, which eliminates the influence of the lone pair of electrons on the surface of the underlying film containing the nitrogen atoms. Consequently, the chemically amplified resist can be applied to the surface of the underlying film free from the influence of the lone pairs of electrons of the nitrogen atoms. As a result, the reaction induced by the acid catalyst in the chemically amplified resist which has been exposed to light proceeds without being influenced by a lone pair of electrons, which enables the formation of a resist pattern having an excellent profile with no footing or undercut.

In the fourth pattern formation method, the underlying-film forming step preferably includes a step of thermally treating an insulating film having a reflowing property and deposited on the semiconductor substrate under an atmosphere of flowing $N_2$ gas so as to cause the insulating film to reflow.

Since the underlying film containing nitrogen atoms is an insulating film formed by the reflow process using the $N_2$ gas, a resist pattern having an excellent profile with no footing or undercut can be formed even on the insulating film caused to reflow under the atmosphere of $N_2$ gas.

In the fourth pattern formation method, the cations implanted in the underlying film are preferably Si cations. Since the Si cations have specified dimensions, they are more likely to remain in the vicinity of the surface of the underlying film to be bonded to the lone pairs of electrons of the nitrogen atoms.

DETAILED DESCRIPTION OF THE INVENTION

First Embodiment

Referring now to FIGS. 1(a) to 1(d), a pattern formation method according to a first embodiment of the present invention will be described.

The first embodiment uses Ar gas instead of the $N_2$ gas used in the conventional pattern formation method to perform a reflow process.

Figure 1A:
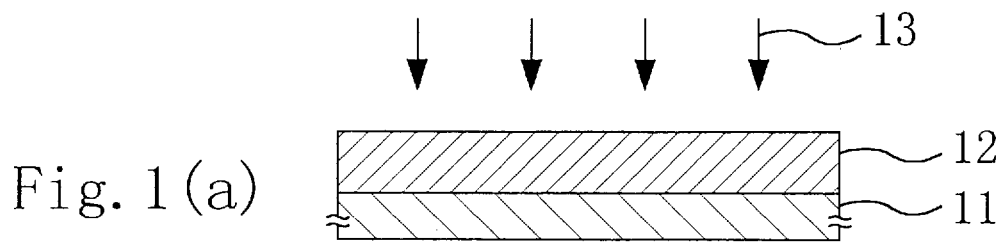
FIGS. 1(a) to 1(d) are cross-sectional views illustrating individual process steps in accordance with a pattern formation method according to a first embodiment of the present invention.

First, as shown in FIG. 1(a), a BPSG film 12 as an insulating film is deposited to a thickness of 700 nm on a semiconductor substrate 11 and subjected to a thermal treatment at a temperature of 850° C. under an atmosphere of flowing Ar gas 13 as inert gas, so that the BPSG film 12 is caused to reflow. Since the $N_2$ gas is not used in the reflow process, a nitride layer is not formed on the surface of the BPSG film 12 and hence no nitrogen atom exists.

When the BPSG film 12 is thermally treated at a temperature of 850° C., precipitation emerges at the surface of the BPSG film 12. The Ar gas 13 as inert gas is allowed to flow to remove the precipitation from the surface of the BPSG film 12. This allows the precipitation to be discharged together with the inert gas.

Figure 1B:
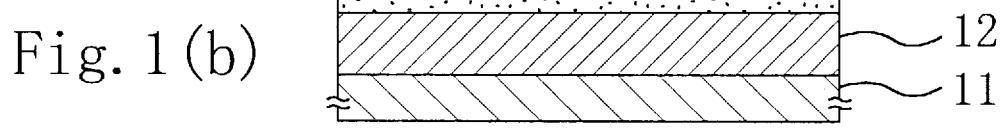

Next, as shown in FIG. 1(b), a binary-system chemically amplified resist (such as WKR-PT-3 commercially available from Wako Pure Chemical Industries, Ltd.) is applied onto the BPSG film 12 by spin coating and subjected to pre-baking at a temperature of 90° C. for 90 seconds, thereby forming a resist film 15.

Figure 1C:
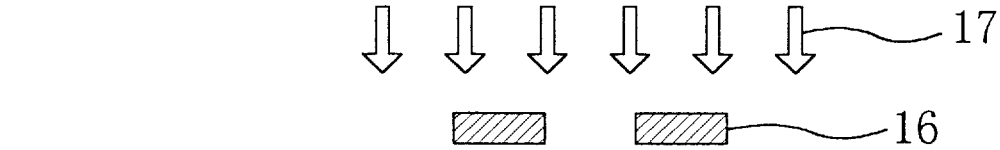

Next, as shown in FIG. 1(c), exposure to a KrF excimer laser 17 is conducted by using a mask 16, followed by post-exposure baking at a temperature of 100° C. for 90 seconds. In the exposed portion of the resist film 15, the decomposition reaction of a compound caused by an acid generated from the chemically amplified resist proceeds. As a result, the alkali-soluble property of the resist film 15 is changed by the reaction induced by an acid catalyst, which enables the formation of a minuscule resist pattern. Since no nitrogen atom and no lone pair of electrons exists at the interface between the BPSG film 12 and the resist film 15, the decomposition reaction of the compound caused by the acid proceeds uniformly.

Figure 1D:
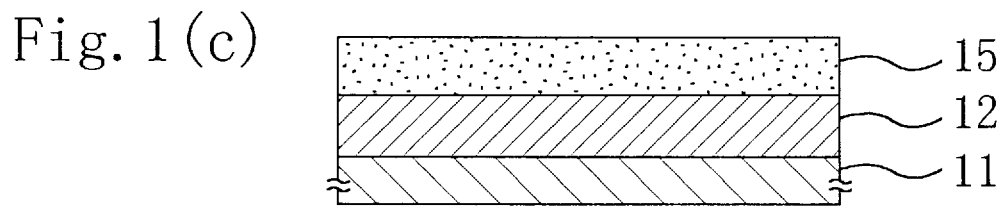

Next, the resist film 15 is developed in an aqueous alkaline solution for 60 seconds to provide a resist pattern having an excellent profile with no footing, as shown in FIG. 1(d).

According to the first embodiment, the BPSG film 12 is caused to reflow by using the Ar gas instead of the $N_2$ gas, so that no nitride layer is formed on the outermost surface of the BPSG film 12. Consequently, the chemically amplified resist is applied onto the BPSG film 12 with no lone pair of electrons, which enables the formation of the resist pattern 18 having an excellent profile with no footing.

Although the first embodiment has used the Ar gas allowed to flow during the reflow process, inert gas containing at least one of He, Ne, Ar, and Kr may be used instead.

Comparative Example of First Embodiment

Initially, a BPSG film as an insulating film is deposited to a thickness of 700 nm on a semiconductor substrate and subjected to a thermal treatment at a temperature of 850° C. under an atmosphere of flowing $N_2$ gas as inert gas, so that the BPSG film is caused to reflow. During the reflow process, a nitride layer is formed from the $N_2$ gas on the surface of the BPSG film.

Figure 2A:
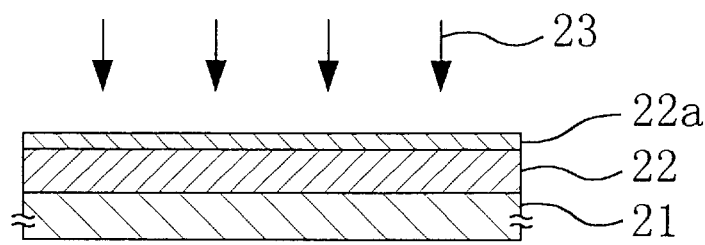
FIGS. 2(a) to 2(e) are cross-sectional views illustrating individual process steps in accordance with a pattern formation method according to a second embodiment of the present invention.
Figure 2B:
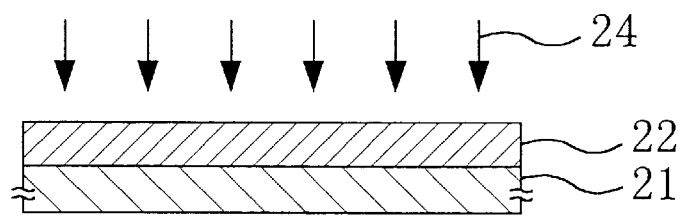
Figure 2C:
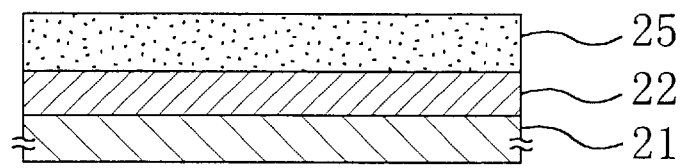

Next, as shown in FIG. 2(c), a binary-system positive chemically amplified resist (such as WKR-PT-3 commercially available from Wako Pure Chemical Industries, Ltd.) is applied onto the BPSG film by spin coating and subjected to pre-baking at a temperature of 90° C. for 90 seconds to form a resist film.

Next, exposure to a KrF excimer laser is conducted by using a mask, followed by post-exposure baking at a temperature of 100° C. for 90 seconds.

Next, the resist film is developed in an aqueous alkaline solution for 60 seconds to provide a resist pattern.

However, footing is observed in the resist pattern formed on the BPSG film.

This confirms the effect of the first embodiment using the Ar gas instead of the $N_2$ gas during the reflow process.

Second Embodiment

Referring next to FIGS. 2(a) to 2(e), a pattern formation method according to a second embodiment of the present invention will be described.

The second embodiment is obtained by adding an extra step of etching away the nitride film formed by the reflow process using the $N_2$ gas to the conventional pattern formation method.

First, as shown in FIG. 2(a), a BPSG film 22 as an insulating film is deposited to a thickness of 700 nm on a semiconductor substrate 21 and subjected to a thermal treatment at a temperature of 850° C. under an atmosphere of flowing $N_2$ gas 23, so that the BPSG film is caused to reflow. During the reflow process, a nitride layer 22a is formed on the BPSG film 22 because of the $N_2$ gas 23 allowed to flow. The $N_2$ gas 23 is allowed to flow to remove precipitation emerging at the surface of the BPSG film 22, similarly to the first embodiment.

Next, as shown in FIG. 2(b), the BPSG film 22 is etched by a thickness of 50 nm by using an aqueous hydrofluoric acid solution 24 to remove the nitride layer 22a. Since the nitride layer 22a has been removed, no nitrogen atom exists on the surface of the BPSG film 22.

Next, a binary-system positive chemically amplified resist (such as WKR-PT-3 commercially available from Wako Pure Chemical Industries, Ltd.) is applied onto the BPSG film 22 by spin coating and subjected to pre-baking at a temperature of 90° C. for 90 seconds to form a resist film 25.

Figure 2D:
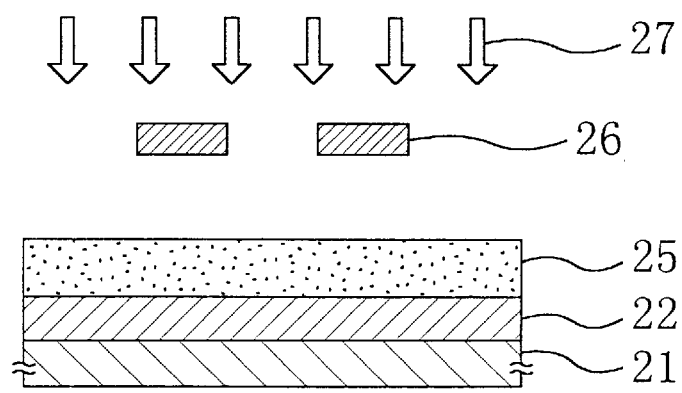

Next, as shown in FIG. 2(d), exposure to a KrF excimer laser 27 is conducted by using a mask 26, followed by post-exposure baking at a temperature of 100° C. for 90 seconds. In the exposed portion of the resist film 25, the decomposition reaction of the compound caused by the acid generated from the chemically amplified resist proceeds. As a result, the alkali-soluble property of the resist film 25 is changed by the reaction induced by the acid catalyst, which enables the formation of a minuscule resist pattern. Since no nitrogen atom and no lone pair of electrons exists at the interface between the BPSG film 22 and the resist film 25, the decomposition reaction of the compound caused by the acid proceeds uniformly.

Figure 2E:
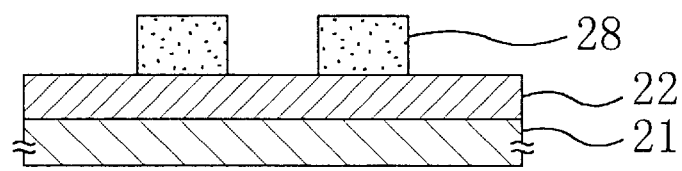

Next, the resist film 25 is developed in an aqueous alkaline solution for 60 seconds to provide a resist pattern having an excellent profile with no footing, as shown in FIG. 2(e).

According to the second embodiment, the nitride layer 22a formed on the outermost surface of the BPSG film 22 by the reflow process using the $N_2$ gas is etched away, which enables the application of the chemically amplified resist to the surface of the BPSG film 22 with no lone pair of electrons, so that the resulting resist pattern 28 has an excellent profile with no footing.

Although the second embodiment has removed the nitride layer 22a by wet etching using the aqueous hydrofluoric acid solution 24, dry etching may also be performed instead.

Third Embodiment

Referring next to FIGS. 3(a) to 3(d), a pattern formation method according to a third embodiment of the present invention will be described.

During the reflow process, third embodiment uses $O_2$ gas instead of the $N_2$ gas used in the conventional pattern formation method.

Figure 3A:
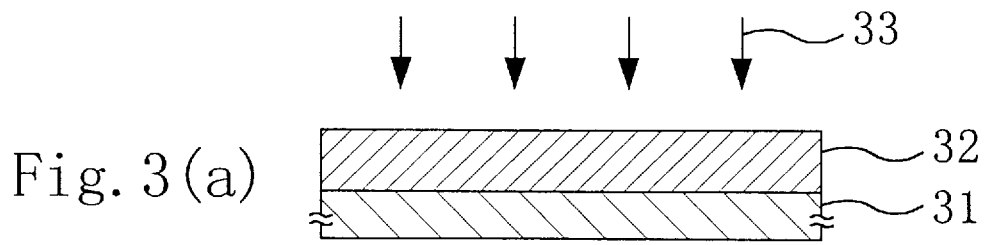
FIGS. 3(a) to 3(d) are cross-sectional views illustrating individual process steps in accordance with a pattern formation method according to a third embodiment of the present invention.

First, as shown in FIG. 3(a), a BPSG film 21 as an insulating film is deposited to a thickness of 700 nm on a semiconductor substrate 31 and subjected to a thermal treatment at a temperature of 850° C. under an atmosphere of flowing $O_2$ gas 33, so that the BPSG film 32 is caused to reflow. The $O_2$ gas 33 is allowed to flow to remove precipitation emerging at the surface of the BPSG film 32, similarly to the first embodiment.

When the BPSG film 32 is caused to reflow under the atmosphere of flowing $O_2$ gas 33, oxygen atoms may pass through the BPSG film 32 and enter the semiconductor substrate 31 to oxide the surface portion of the semiconductor substrate 31. In the case of causing the BPSG film 32 to reflow under the atmosphere of flowing $O_2$ gas, therefore, a nitride film such as a SiN film which barely allows the oxygen atoms to pass therethrough is preferably formed under the BPSG film 32. With the nitride film, the oxygen atoms are less likely to enter the semiconductor substrate 31 so that the surface portion of the semiconductor substrate 31 is prevented from being oxidized.

Figure 3B:
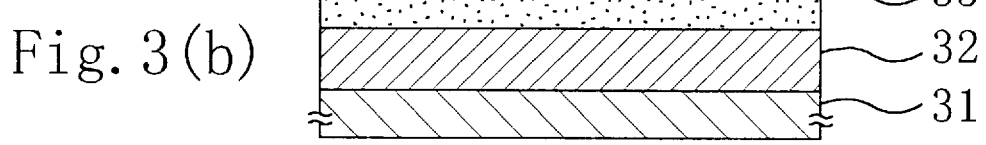

Next, as shown in FIG. 3(b), a binary-system positive chemically amplified resist (such as WKR-PT-3 commercially available from Wako Pure Chemical Industries, Ltd.) is applied onto the BPSG film 32 by spin coating and subjected to pre-baking at a temperature of 90° C. for 90 seconds to form a resist film 35.

Figure 3C:
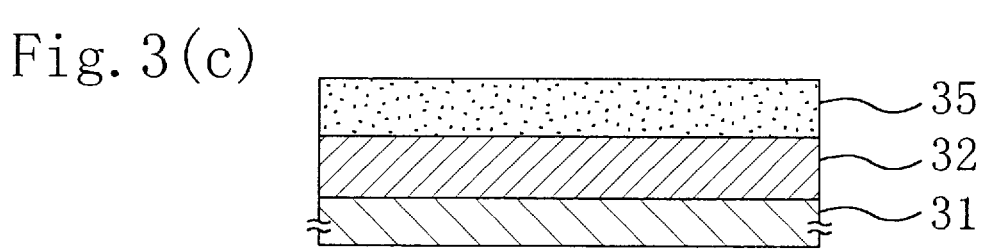

Next, as shown in FIG. 3(c), exposure to a KrF excimer laser 27 is conducted by using a mask 36, followed by post-exposure baking at a temperature of 100° C. for 90 seconds. In the exposed portion of the resist film 35, the decomposition reaction of the compound caused by the acid generated from the chemically amplified resist proceeds. As a result, the alkali-soluble property of the resist film 35 is changed by the reaction induced by the acid catalyst, which enables the formation of a minuscule resist pattern. Since no nitrogen atom and no lone pair of electrons exists at the interface between the BPSG film 32 and the resist film 25, the decomposition reaction of the compound caused by the acid proceeds uniformly.

The absence of a nitrogen atom on the outermost surface of the BPSG film 32 may be attributed to the reflow process performed without using the $N_2$ gas or to the oxide film formed on the surface of the BPSG film 32 by the reflow process using the $O_2$ gas, which prevents the formation of the nitrogen layer.

Figure 3D:
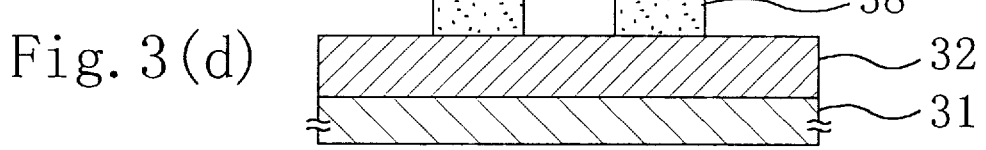

Next, the resist film 35 is developed in an aqueous alkaline solution for 60 seconds to provide a resist pattern having an excellent profile with no footing, as shown in FIG. 3(d).

According to the third embodiment, since the $O_2$ gas instead of $N_2$ gas is used to cause the BPSG film 32 to reflow, no nitride layer is formed on the outermost surface of the BPSG film 32, which enables the application of the chemically amplified resist to the surface of the BPSG film 32 with no lone pair of electrons, so that the resulting resist pattern 38 has an excellent profile.

Although the third embodiment has used the $O_2$ gas as the gas containing oxygen atoms allowed to flow during the reflow process, $O_3$ gas or a mixture of $O_2$ gas and $H_2$ gas may be used instead.

Fourth Embodiment

Referring next to FIGS. 4(a) to 4(e), a pattern formation method according to a fourth embodiment of the present invention will be described.

The fourth embodiment is obtained by adding an extra step of implanting Si cations in the insulating film having the nitride layer formed by the reflow process using the $N_2$ gas to the conventional pattern formation method.

Figure 4A:
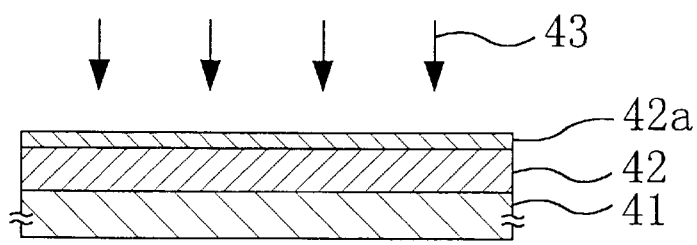
FIGS. 4(a) to 4(e) are cross-sectional views illustrating individual process steps in accordance with a pattern formation method according to a fourth embodiment of the present invention.

First, as shown in FIG. 4(a), a BPSG film 42 as an insulating film is deposited to a thickness of 700 nm on a semiconductor substrate 41 and subjected to a thermal treatment at a temperature of 850° C. under an atmosphere of $N_2$ gas 43, so that the BPSG film 42 is caused to reflow. During the reflow process, a nitride layer 42a is formed on the surface of the BPSG film 42 because of the $N_2$ gas 43 allowed to flow, so that the resulting BPSG film 42 contains nitrogen atoms in the surface thereof. The $N_2$ gas 43 is allowed to flow to remove precipitation emerging at the surface of the BPSG film 42, similarly to the first embodiment.

Figure 4B:
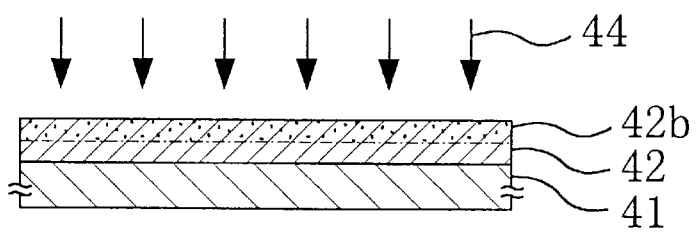

Next, as shown in FIG. 4(b), Si cations 44 are implanted in the BPSG film 42 to form a cation injection layer 42b on the surface of the BPSG film 42. During the cation implanting process, the cations in the cation injection layer 42b are bonded to the lone pairs of electrons of nitrogen atoms in the nitride layer 42a (see FIG. 4(a)) in the vicinity of the surface of the BPSG film 42.

Figure 5A:
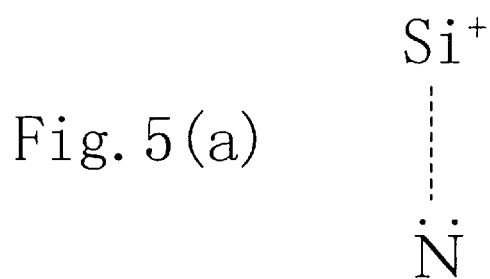
FIGS. 5(a) and 5(b) illustrate the action of cations used in the pattern formation method according to the fourth embodiment of the present invention.

FIG. 5(a) shows the bonding between the Si cation and the lone pair of electrons of the nitrogen atom. Because of the bonding, the lone pair of electrons of the nitrogen atom no more affects the reaction induced by the acid catalyst.

Figure 4C:
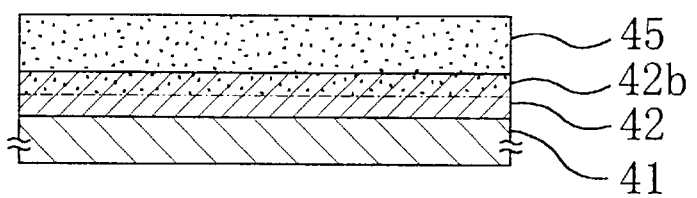

Next, as shown in FIG. 4(c), a binary-system positive chemically amplified resist (such as WKR-PT-3 commercially available from Wako Pure Chemical Industries, Ltd.) is applied onto the BPSG film 42 by spin coating and subjected to pre-baking at a temperature of 90° C. for 90 seconds to form a resist film 45.

Figure 4D:
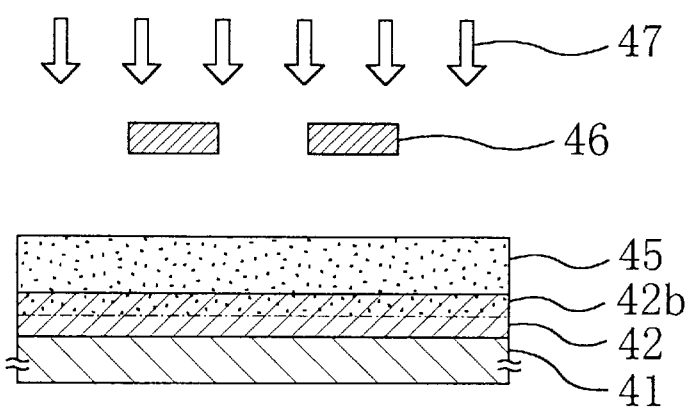

Next, as shown in FIG. 4(d), exposure to a KrF excimer laser 47 is conducted by using a mask 46, followed by post-exposure baking at a temperature of 100° C. for 90 seconds. In the exposed portion of the resist film 45, the decomposition reaction of the compound caused by the acid generated from the chemically amplified resist proceeds. As a result, the alkali-soluble property of the resist film 45 is changed by the reaction induced by the acid catalyst, which enables the formation of a minuscule resist pattern. Since the Si cations in the cation injection layer 42b are bonded to the lone pairs of electrons of the nitrogen atoms in the nitride layer 42a at the interface between the BPSG film 42 and the resist film 45, the lone pairs of electrons will not deactivate the acid generated in the exposed portion of the resist film 45, so that the decomposition reaction of the compound caused by the acid proceeds uniformly.

Figure 4E:
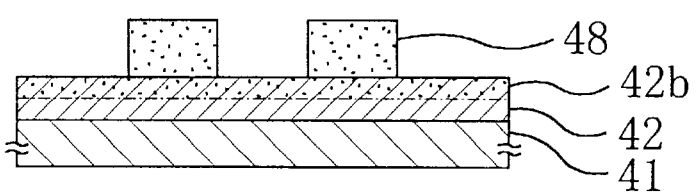

Next, the resist film 45 is developed in an aqueous alkaline solution for 60 seconds to provide a resist pattern 48 having an excellent profile with no footing, as shown in FIG. 4(e).

According to the fourth embodiment, the Si cations 44 are implanted in the BPSG film 42 having the nitride layer 42a formed by the reflow process using the $N_2$ gas and bonded to the lone pairs of the nitrogen atoms, thereby eliminating the influence of the lone pairs of electrons. Since the chemically amplified resist can be applied to the surface of the BPSG film 42 free from the influence of the lone pairs of electrons, the resulting resist pattern 48 has an excellent profile with no footing.

If Si cations having specified dimensions are used, the cations are more likely to remain in the vicinity of the surface of the BPSG film 42, so that the effect of being bonded to the lone pairs of electrons on the surface of the BPSG film 42 is enhanced.

Figure 5B:
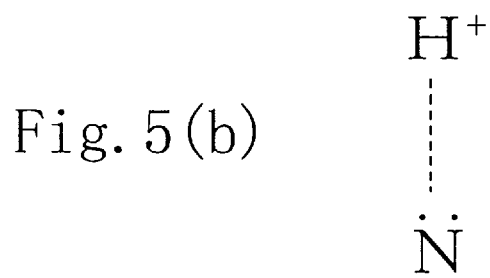
Figure 6A:
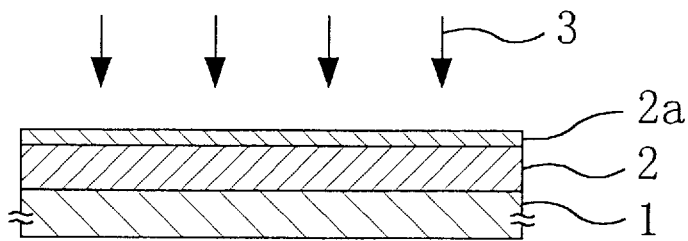
FIGS. 6(a) to 6(d) are cross-sectional views illustrating individual process steps in accordance with a pattern formation method according to a first conventional embodiment.
Figure 6B:
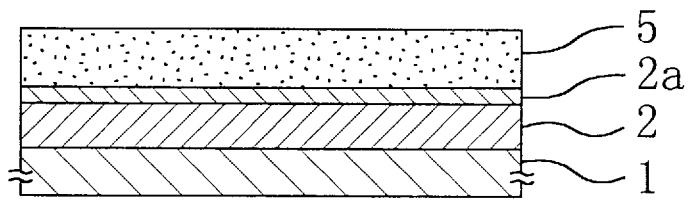
Figure 6C:
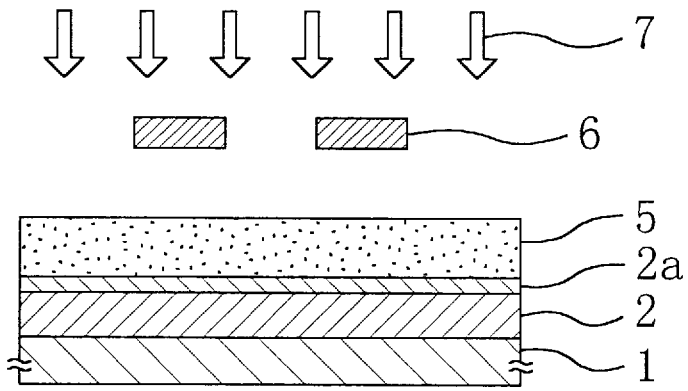
Figure 6D:
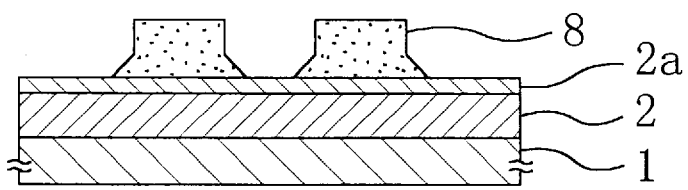
Figure 7:
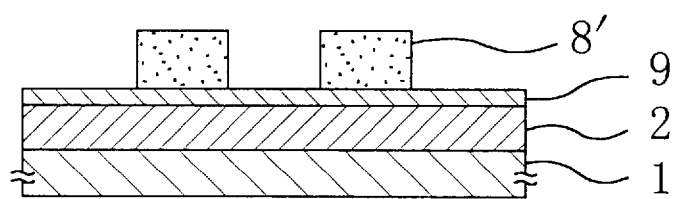
FIG. 7 is a cross-sectional view of a pattern formed by a second conventional pattern formation method.

Although the fourth embodiment has implanted the Si cations 44, other cations such as H cations may be used instead. FIG. 5(b) shows the bonding between the H cation and the lone pair of electrons of the nitrogen atom. Because of the bonding, the lone pair of electrons of the nitrogen atom no more affects the reaction induced by the acid catalyst.

The implantation of the cations may be performed by ion implantation or by plasma doping.

Although the film containing nitrogen atoms used in the fourth embodiment is obtained by causing the BPSG film 42 formed on the semiconductor substrate 41 to reflow under the atmosphere of $N_2$ gas, it is also possible to use a nitride film such as a TiN or SiN film formed on the semiconductor substrate 41.

As the chemically amplified resist used in the first to fourth embodiments, there may be used a binary-system chemically amplified resist composed of a resin containing a protecting group eliminated by an acid and an acid generator or a ternary-system chemically amplified resist composed of an alkali-soluble resin, a compound or a resin containing a protecting group, and an acid generator. Either a positive chemically amplified resist or a negative chemically amplified resist may be used.

Although each of the first to fourth embodiments has used the BPSG film as the insulating film, another insulating film having the reflowing property such as a BSG film, a PSG film, or a SOG film may be used instead.

Although the individual reflow processes have been performed under the atmosphere of flowing Ar gas 13, $N_2$ gas 23, $O_2$ gas 33, and $N_2$ gas 43 in the first, second, third, and fourth embodiments, the gases are allowed to flow to remove precipitation emerging at the surfaces of the BPSG films. Therefore, the gas may also be allowed to flow by degassing the ambient atmosphere instead of allowing the gas to flow by supplying the gas.

We claim:

1. A pattern formation method comprising:

an insulating-film depositing step of depositing an insulating film having a reflowing property on a semiconductor substrate;

a reflow step of thermally treating said insulating film under an atmosphere of flowing inert gas so as to cause said insulating film to reflow, said inert gas comprising at least one gas selected from the group consisting He, Ne, Ar, Kr, and Xe;

a resist-film forming step of applying a chemically amplified resist to a surface of the insulating film caused to reflow to form a resist film; and a pattern forming step of exposing said resist film to light and developing the exposed resist film to form a pattern composed of said resist film.

2. A pattern formation method comprising:

an insulating-film depositing step of depositing an insulating film having a reflowing property on a semiconductor substrate;

a reflow step of thermally treating said insulating film under an atmosphere of flowing gas containing oxygen atoms so as to cause said insulating film to reflow;

a resist-film forming step of applying a chemically amplified resist to a surface of the insulating film caused to reflow to form a resist film; and a pattern forming step of exposing said resist film to light and developing the exposed resist film to form a pattern composed of said resist film.

3. A pattern formation method comprising:

an insulating-film depositing step of depositing an insulating film having a reflowing property on a semiconductor substrate;

a reflow step of thermally treating said insulating film under an atmosphere of flowing $N_2$ gas so as to cause said insulating film to reflow;

a surface-layer removing step of removing a surface layer of the insulating film caused to reflow;

a resist-film forming step of applying a chemically amplified resist to a surface of said insulating film from which the surface layer has been removed to form a resist film; and a pattern forming step of exposing said resist film to light and developing the exposed resist film to form a pattern composed of said resist film.

4. A pattern formation method comprising:

an insulating film forming step of forming an insulating film containing nitrogen atoms on a semiconductor substrate;

a reflow step of thermally treating said insulating film under an atmosphere of flowing $N_2$ gas so as to cause said insulating film to reflow;

a cation implanting step of implanting cations in said insulating film;

a resist film forming step of applying a chemically amplified resist to a surface of said insulating film in which the cations have been implanted; and a pattern forming step of exposing said resist film to light and developing the exposed resist film to form a pattern composed of said resist film.

5. A pattern formation method according to claim 4, wherein the cations implanted in said insulating film are Si cations.

* * * * *